United States Patent
Qin et al.

(10) Patent No.: US 11,138,052 B2
(45) Date of Patent: Oct. 5, 2021

(54) SYSTEM AND METHOD FOR SUPPORTING DATA COMMUNICATION IN A MOVABLE PLATFORM

(71) Applicant: SZ DJI TECHNOLOGY CO., LTD., Shenzhen (CN)

(72) Inventors: Dong Qin, Shenzhen (CN); Mingli Cui, Shenzhen (CN); Jin Xie, Shenzhen (CN); Shengbao Yin, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/729,978

(22) Filed: Dec. 30, 2019

(65) Prior Publication Data
US 2020/0133747 A1 Apr. 30, 2020

Related U.S. Application Data

(63) Continuation of application No. PCT/CN2017/090996, filed on Jun. 30, 2017.

(51) Int. Cl.
*G06F 13/00* (2006.01)
*G06F 9/54* (2006.01)
(Continued)

(52) U.S. Cl.
CPC ............ *G06F 9/544* (2013.01); *G06F 9/3877* (2013.01); *G06F 11/3037* (2013.01); *G06F 12/0246* (2013.01); *G06F 13/1673* (2013.01)

(58) Field of Classification Search
CPC .... G06F 9/544; G06F 9/3877; G06F 11/3037; G06F 12/0246; G06F 13/1673; G06F 15/167; G11C 7/16; G11C 7/1084
See application file for complete search history.

(56) References Cited

U.S. PATENT DOCUMENTS 6,392,654 B1 * 5/2002 Gallotta ............... G06T 1/60
345/503
2002/0143973 A1 * 10/2002 Price ................. H04L 65/4076
709/231
(Continued)

FOREIGN PATENT DOCUMENTS

CN  103557875 A  2/2014
CN  106447596 A  2/2017
(Continued)

OTHER PUBLICATIONS

The World Intellectual Property Organization (WIPO) International Search Report and Written Opinion for PCT/CN2017/090996 dated Mar. 28, 2018 7 pages.

*Primary Examiner* — Jing-Yih Shyu
(74) *Attorney, Agent, or Firm* — Anova Law Group, PLLC

(57) ABSTRACT

A system includes a memory buffer, a first data processor, a second data processor, and a controller. The first data processor performs a write operation to write data into the memory buffer and provides a first reference indicating a status or progress of the write operation. The controller provides a second reference indicating a buffer block in the memory buffer. The second data processor receives the first reference and the second reference, uses a threshold and the first reference to determine whether the buffer block contains enough data to be processed by the second data processor, obtains data to be processed from the buffer block using the second reference if the buffer block contains enough data to be processed, and processes the data obtained from the buffer block.

19 Claims, 13 Drawing Sheets

(51) Int. Cl.
  *G06F 9/38*   (2018.01)
  *G06F 11/30*  (2006.01)
  *G06F 12/02*  (2006.01)
  *G06F 13/16*  (2006.01)

(56) References Cited

U.S. PATENT DOCUMENTS

2011/0225376 A1   9/2011  Hasting et al.
2017/0134730 A1*  5/2017  Zheng .................. H04N 19/152

FOREIGN PATENT DOCUMENTS

| CN | 106463164 A | 2/2017 |
| EP | 3101876 A1 | 12/2015 |
| WO | 2005006195 A2 | 1/2005 |

* cited by examiner

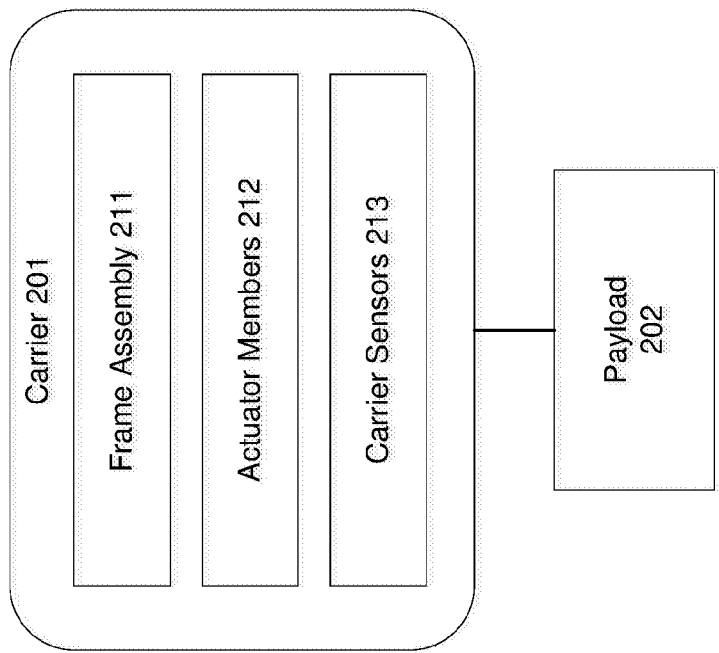
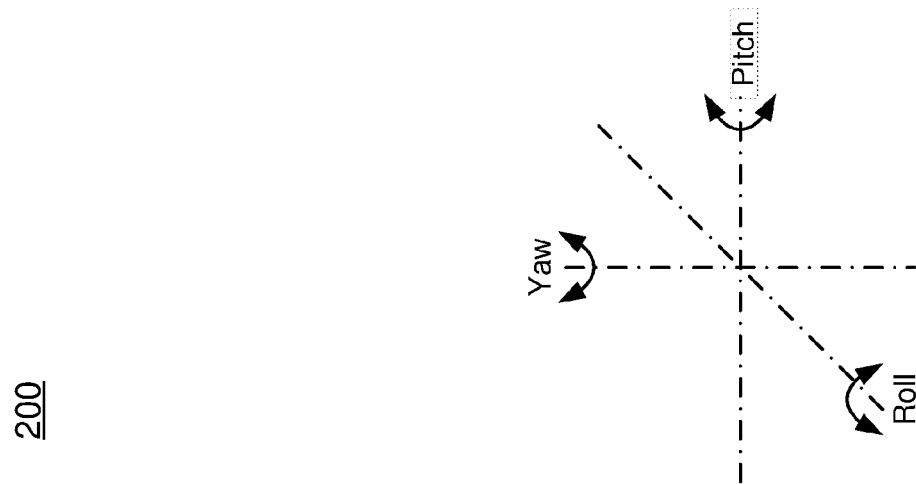
Figure 2

SYSTEM AND METHOD FOR SUPPORTING DATA COMMUNICATION IN A MOVABLE PLATFORM

CROSS-REFERENCE TO RELATED APPLICATION

This application is a continuation of International Application No. PCT/CN2017/090996, filed Jun. 30, 2017, the entire content of which is incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The disclosed embodiments relate generally to operating a movable platform and more particularly, but not exclusively, to support data processing on a movable platform.

BACKGROUND

Movable platforms such as unmanned aerial vehicles (UAVs) can be used for performing surveillance, reconnaissance, and exploration tasks for military and civilian applications. A movable platform can carry different types of sensors that are capable of sensing the surrounding environment. Vast amount of data, such as image data, may need to be processed efficiently with low latency on the movable platform. This is the general area that embodiments of the disclosure are intended to address.

SUMMARY

Described herein are systems and methods that can support data processing on a movable platform. The system comprises a memory buffer with a plurality of buffer blocks. A first data processor can perform a write operation to write data into the memory buffer, and provide a first reference indicating a status or progress of the write operation to a second data processor. Furthermore, a controller can provide a second reference, indicating a first buffer block in the memory buffer, to the second data processor. Then, the second data processor can determine, based on the first reference, whether the first buffer block contains enough data to be processed by the second data process. When the first buffer block contains enough data to be processed, the second data processor can obtain and process the data from the first buffer block using the second reference received from the controller.

BRIEF DESCRIPTION OF DRAWINGS

FIG. 2 illustrates an exemplary carrier in a movable platform environment, in accordance with embodiments.

DETAILED DESCRIPTION

The disclosure is illustrated, by way of example and not by way of limitation, in the figures of the accompanying drawings in which like references indicate similar elements. It should be noted that references to "an" or "one" or "some" embodiment(s) in this disclosure are not necessarily to the same embodiment, and such references mean at least one.

The description of the embodiments as following uses an unmanned aerial vehicle (UAV) as example for a movable platform. It will be apparent to those skilled in the art that other types of movable platform can be used without limitation.

In accordance with various embodiments of the present disclosure, the system can provide a technical solution for supporting data processing on a movable platform. The system comprises a memory buffer with a plurality of buffer blocks. A first data processor can perform a write operation to write data into the memory buffer, and provide a first reference indicating a status or progress of the write operation by the first data processor to a second data processor. Furthermore, a controller can provide a second reference, indicating a first buffer block in the memory buffer, to the second data processor. Then, the second data processor can determine, based on the first reference, whether the first buffer block contains enough data to be processed by the second data process. When the first buffer block contains enough data to be processed, the second data processor can obtain and process the data from the first buffer block using the second reference received from the controller.

Figure 1:
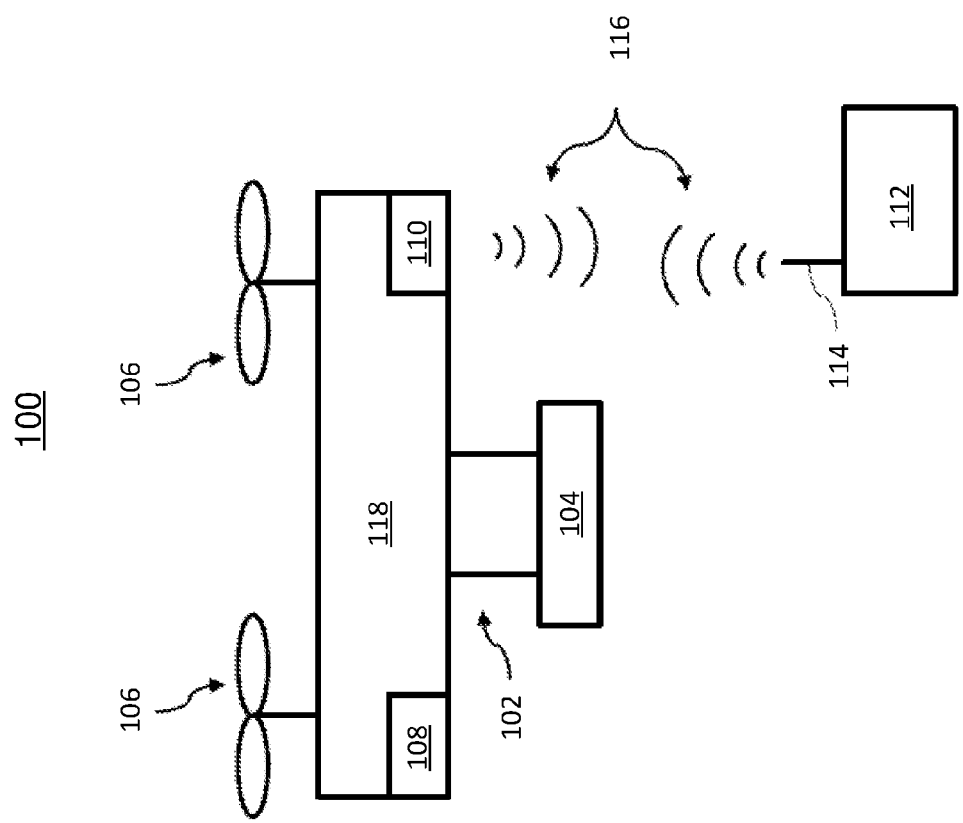
FIG. 1 illustrates a movable platform environment, in accordance with various embodiments of the present disclosure.

FIG. 1 illustrates a movable platform environment, in accordance with various embodiments of the present disclosure. As shown in FIG. 1, a movable platform 118 (also referred to as a movable object) in a movable platform environment 100 can include a carrier 102 and a payload 104. Although the movable platform 118 can be depicted as an aircraft, this depiction is not intended to be limiting, and any suitable type of movable platform can be used. One of skill in the art would appreciate that any of the embodiments described herein in the context of aircraft systems can be applied to any suitable movable platform (e.g., a UAV). In some instances, the payload 104 may be provided on the movable platform 118 without requiring the carrier 102.

In accordance with various embodiments of the present disclosure, the movable platform 118 may include one or more movement mechanisms 106 (e.g. propulsion mechanisms), a sensing system 108, and a communication system 110.

The movement mechanisms 106 can include one or more of rotors, propellers, blades, engines, motors, wheels, axles, magnets, nozzles, or any mechanism that can be used by animals, or human beings for effectuating movement. For example, the movable platform may have one or more propulsion mechanisms. The movement mechanisms 106 may all be of the same type. Alternatively, the movement mechanisms 106 can be different types of movement mechanisms. The movement mechanisms 106 can be mounted on the movable platform 118 (or vice-versa), using any suitable means such as a support element (e.g., a drive shaft). The movement mechanisms 106 can be mounted on any suitable portion of the movable platform 118, such on the top, bottom, front, back, sides, or suitable combinations thereof.

In some embodiments, the movement mechanisms 106 can enable the movable platform 118 to take off vertically from a surface or land vertically on a surface without requiring any horizontal movement of the movable platform 118 (e.g., without traveling down a runway). Optionally, the movement mechanisms 106 can be operable to permit the movable platform 118 to hover in the air at a specified position and/or orientation. One or more of the movement mechanisms 106 may be controlled independently of the other movement mechanisms. Alternatively, the movement mechanisms 106 can be configured to be controlled simultaneously. For example, the movable platform 118 can have multiple horizontally oriented rotors that can provide lift and/or thrust to the movable platform. The multiple horizontally oriented rotors can be actuated to provide vertical takeoff, vertical landing, and hovering capabilities to the movable platform 118. In some embodiments, one or more of the horizontally oriented rotors may spin in a clockwise direction, while one or more of the horizontally rotors may spin in a counterclockwise direction. For example, the number of clockwise rotors may be equal to the number of counterclockwise rotors. The rotation rate of each of the horizontally oriented rotors can be varied independently in order to control the lift and/or thrust produced by each rotor, and thereby adjust the spatial disposition, velocity, and/or acceleration of the movable platform 118 (e.g., with respect to up to three degrees of translation and up to three degrees of rotation).

The sensing system 108 can include one or more sensors that may sense the spatial disposition, velocity, and/or acceleration of the movable platform 118 (e.g., with respect to various degrees of translation and various degrees of rotation). The one or more sensors can include any of the sensors, including GPS sensors, motion sensors, inertial sensors, proximity sensors, or image sensors. The sensing data provided by the sensing system 108 can be used to control the spatial disposition, velocity, and/or orientation of the movable platform 118 (e.g., using a suitable processing unit and/or control module). Alternatively, the sensing system 108 can be used to provide data regarding the environment surrounding the movable platform, such as weather conditions, proximity to potential obstacles, location of geographical features, location of manmade structures, and the like.

The communication system 110 enables communication with terminal 112 having a communication system 114 via wireless signals 116. The communication systems 110, 114 may include any number of transmitters, receivers, and/or transceivers suitable for wireless communication. The communication may be one-way communication, such that data can be transmitted in only one direction. For example, one-way communication may involve only the movable platform 118 transmitting data to the terminal 112, or vice-versa. The data may be transmitted from one or more transmitters of the communication system 110 to one or more receivers of the communication system 114, or vice-versa. Alternatively, the communication may be two-way communication, such that data can be transmitted in both directions between the movable platform 118 and the terminal 112. The two-way communication can involve transmitting data from one or more transmitters of the communication system 110 to one or more receivers of the communication system 114, and vice-versa.

In some embodiments, the terminal 112 can provide control data to one or more of the movable platform 118, carrier 102, and payload 104 and receive information from one or more of the movable platform 118, carrier 102, and payload 104 (e.g., position and/or motion information of the movable platform, carrier or payload; data sensed by the payload such as image data captured by a payload camera; and data generated from image data captured by the payload camera). In some instances, control data from the terminal may include instructions for relative positions, movements, actuations, or controls of the movable platform, carrier, and/or payload. For example, the control data may result in a modification of the location and/or orientation of the movable platform (e.g., via control of the movement mechanisms 106), or a movement of the payload with respect to the movable platform (e.g., via control of the carrier 102). The control data from the terminal may result in control of the payload, such as control of the operation of a camera or other image capturing device (e.g., taking still or moving pictures, zooming in or out, turning on or off, switching imaging modes, change image resolution, changing focus, changing depth of field, changing exposure time, changing viewing angle or field of view).

In some instances, the communications from the movable platform, carrier and/or payload may include information from one or more sensors (e.g., of the sensing system 108 or of the payload 104) and/or data generated based on the sensing information. The communications may include sensed information from one or more different types of sensors (e.g., GPS sensors, motion sensors, inertial sensor, proximity sensors, or image sensors). Such information may pertain to the position (e.g., location, orientation), movement, or acceleration of the movable platform, carrier, and/or payload. Such information from a payload may include data captured by the payload or a sensed state of the payload. The control data transmitted by the terminal 112 can be configured to control a state of one or more of the movable platform 118, carrier 102, or payload 104. Alternatively or in combination, the carrier 102 and payload 104 can also each include a communication module configured to communicate with terminal 112, such that the terminal can communicate with and control each of the movable platform 118, carrier 102, and payload 104 independently.

In some embodiments, the movable platform 118 can be configured to communicate with another remote device in addition to the terminal 112, or instead of the terminal 112. The terminal 112 may also be configured to communicate with another remote device as well as the movable platform 118. For example, the movable platform 118 and/or terminal 112 may communicate with another movable platform, or a carrier or payload of another movable platform. When desired, the remote device may be a second terminal or other computing device (e.g., computer, laptop, tablet, smartphone, or other mobile device). The remote device can be configured to transmit data to the movable platform 118, receive data from the movable platform 118, transmit data to the terminal 112, and/or receive data from the terminal 112. Optionally, the remote device can be connected to the Internet or other telecommunications network, such that data received from the movable platform 118 and/or terminal 112 can be uploaded to a website or server.

FIG. 2 illustrates an exemplary carrier in a movable platform environment, in accordance with embodiments. The carrier 200 can be used to couple a payload 202 such as an image capturing device to a movable platform such as a UAV.

The carrier 200 can be configured to permit the payload 202 to rotate about one or more axes, such as three axes: X or pitch axis, Z or roll axis, and Y or yaw axis, relative to the movable platform. For instance, the carrier 200 may be configured to permit the payload 202 to rotate only around one, two, or three of the axes. The axes may or may not be orthogonal to each other. The range of rotation around any of the axes may or may not be limited and may vary for each of the axes. The axes of rotation may or may not intersect with one another. For example, the orthogonal axes may intersect with one another. They may or may not intersect at a payload 202. Alternatively, they may not intersect.

The carrier 200 can include a frame assembly 211 comprising one or more frame members. For example, a frame member can be configured to be coupled with and support the payload 202 (e.g., image capturing device).

In some embodiments, the carrier 201 can comprise one or more carrier sensors 213 useful for determining a state of the carrier 201 or the payload 202 carried by the carrier 201. The state information may include a spatial disposition (e.g., position, orientation, or attitude), a velocity (e.g., linear or angular velocity), an acceleration (e.g., linear or angular acceleration), and/or other information about the carrier, a component thereof, and/or the payload 202. In some embodiments, the state information as acquired or calculated from the sensor data may be used as feedback data to control the rotation of the components (e.g., frame members) of the carrier. Examples of such carrier sensors may include motion sensors (e.g., accelerometers), rotation sensors (e.g., gyroscope), inertial sensors, and the like.

The carrier sensors 213 may be coupled to any suitable portion or portions of the carrier (e.g., frame members and/or actuator members) and may or may not be movable relative to the UAV. Additionally or alternatively, at least some of the carrier sensors may be coupled directly to the payload 202 carried by the carrier 201.

The carrier sensors 213 may be coupled with some or all of the actuator members of the carrier. For example, three carrier sensors can be respectively coupled to the actuator members 212 for a three-axis carrier and configured to measure the driving of the respective actuator members 212 for the three-axis carrier. Such sensors can include potentiometers or other similar sensors. In an embodiment, a sensor (e.g., potentiometer) can be inserted on a motor shaft of a motor so as to measure the relative position of a motor rotor and motor stator, thereby measuring the relative position of the rotor and stator and generating a position signal representative thereof. In an embodiment, each actuator-coupled sensor is configured to provide a positional signal for the corresponding actuator member that it measures. For example, a first potentiometer can be used to generate a first position signal for the first actuator member, a second potentiometer can be used to generate a second position signal for the second actuator member, and a third potentiometer can be used to generate a third position signal for the third actuator member. In some embodiments, carrier sensors 213 may also be coupled to some or all of the frame members of the carrier. The sensors may be able to convey information about the position and/or orientation of one or more frame members of the carrier and/or the image capturing device. The sensor data may be used to determine position and/or orientation of the image capturing device relative to the movable platform and/or a reference frame.

The carrier sensors 213 can provide position and/or orientation data that may be transmitted to one or more controllers (not shown) on the carrier or movable platform. The sensor data can be used in a feedback-based control scheme. The control scheme can be used to control the driving of one or more actuator members such as one or more motors. One or more controllers, which may be situated on a carrier or on a movable platform carrying the carrier, can generate control signals for driving the actuator members. In some instances, the control signals can be generated based on data received from carrier sensors indicative of the spatial disposition of the carrier or the payload 202 carried by the carrier 201. The carrier sensors may be situated on the carrier or the payload 202, as previously described herein. The control signals produced by the controllers can be received by the different actuator drivers. Based on the control signals, the different actuator drivers may control the driving of the different actuator members, for example, to effect a rotation of one or more components of the carrier. An actuator driver can include hardware and/or software components suitable for controlling the driving of a corresponding actuator member and receiving position signals from a corresponding sensor (e.g., potentiometer). The control signals can be transmitted simultaneously to the actuator drivers to produce simultaneous driving of the actuator members. Alternatively, the control signals can be transmitted sequentially, or to only one of the actuator drivers. Advantageously, the control scheme can be used to provide feedback control for driving actuator members of a carrier, thereby enabling more precise and accurate rotation of the carrier components.

In some instances, the carrier 201 can be coupled indirectly to the UAV via one or more damping elements. The damping elements can be configured to reduce or eliminate movement of the load (e.g., payload, carrier, or both) caused by the movement of the movable platform (e.g., UAV). The damping elements can include any element suitable for damping motion of the coupled load, such as an active damping element, a passive damping element, or a hybrid damping element having both active and passive damping characteristics. The motion damped by the damping elements provided herein can include one or more of vibrations, oscillations, shaking, or impacts. Such motions may originate from motions of the movable platform that are transmitted to the load. For example, the motion may include vibrations caused by the operation of a propulsion system and/or other components of a UAV.

The damping elements may provide motion damping by isolating the load from the source of unwanted motion by dissipating or reducing the amount of motion transmitted to the load (e.g., vibration isolation). The damping elements may reduce the magnitude (e.g., amplitude) of the motion that would otherwise be experienced by the load. The motion damping applied by the damping elements may be used to stabilize the load, thereby improving the quality of images captured by the load (e.g., image capturing device), as well as reducing the computational complexity of image stitching steps required to generate a panoramic image based on the captured images.

The damping elements described herein can be formed from any suitable material or combination of materials, including solid, liquid, or gaseous materials. The materials used for the damping elements may be compressible and/or deformable. For example, the damping elements can be made of sponge, foam, rubber, gel, and the like. For example, damping elements can include rubber balls that are substantially spherical in shape. The damping elements can be of any suitable shape such as substantially spherical, rectangular, cylindrical, and the like. Alternatively or in addition, the damping elements can include piezoelectric materials or shape memory materials. The damping elements can include one or more mechanical elements, such as springs, pistons, hydraulics, pneumatics, dashpots, shock absorbers, isolators, and the like. The properties of the damping elements can be selected so as to provide a predetermined amount of motion damping. In some instances, the damping elements may have viscoelastic properties. The properties of the damping elements may be isotropic or anisotropic. For instance, the damping elements may provide motion damping equally along all directions of motion. Conversely, the damping element may provide motion damping only along a subset of the directions of motion (e.g., along a single direction of motion). For example, the damping elements may provide damping primarily along the Y (yaw) axis. As such, the illustrated damping elements can be configured to reduce vertical motions.

Although various embodiments may be depicted as utilizing a single type of damping elements (e.g., rubber balls), it shall be understood that any suitable combination of types of damping elements can be used. For example, the carrier may be coupled to the movable platform using one or more damping elements of any suitable type or types. The damping elements may have the same or different characteristics or properties such as stiffness, viscoelasticity, and the like. Each damping element can be coupled to a different portion of the load or only to a certain portion of the load. For instance, the damping elements may be located near contact or coupling points or surfaces of between the load and the movable platforms. In some instances, the load can be embedded within or enclosed by one or more damping elements.

Figure 3:
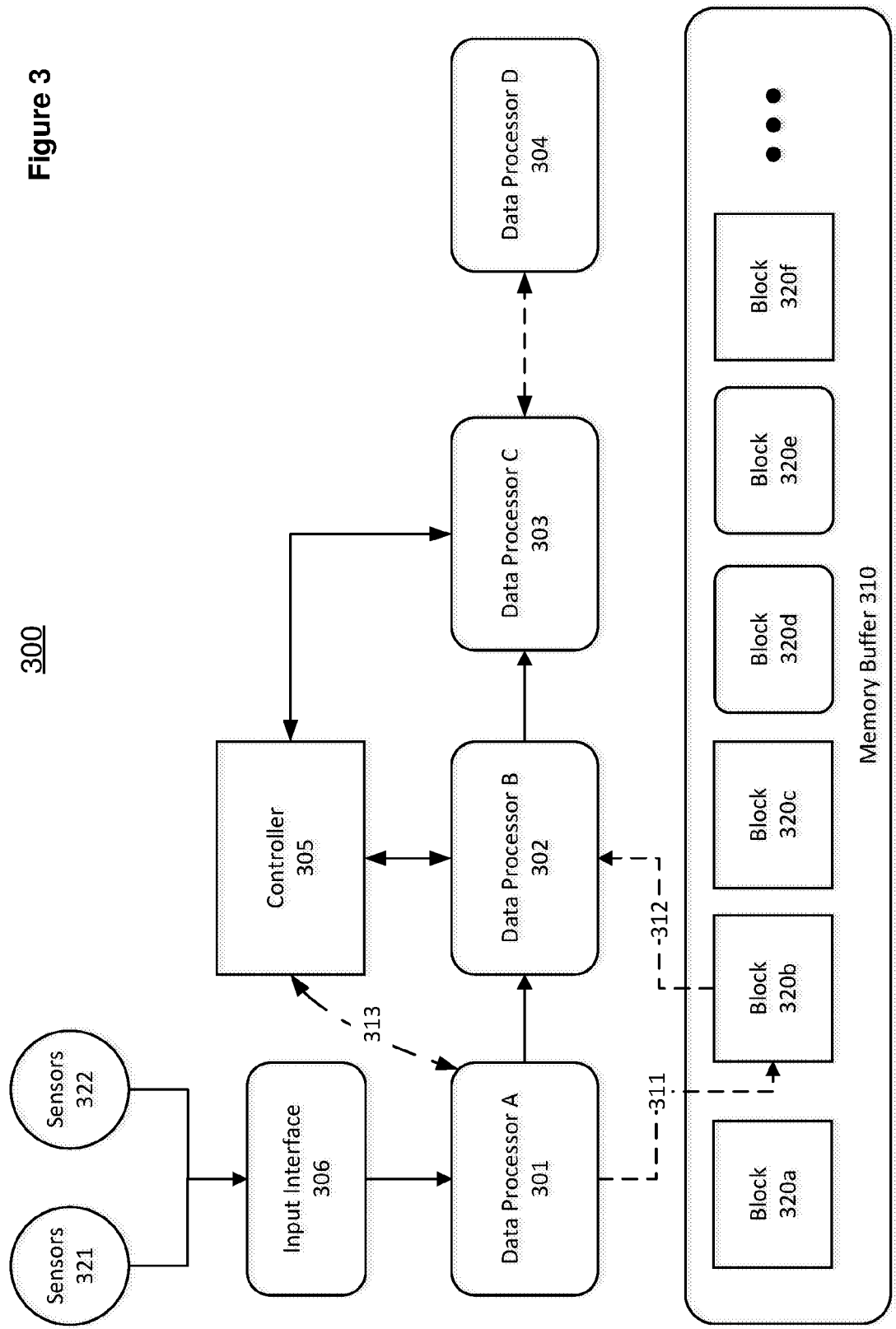
FIG. 3 illustrates an exemplary data processing system, in accordance with various embodiments.

FIG. 3 illustrates an exemplary data processing system, in accordance with various embodiments. As shown in FIG. 3, the data processing system 300 can employ a plurality of data processors, such as data processors A-D 301-304, for processing data received from one or more sensors 321-322. For example, the data processor A 301 can be a data input processor, which may be responsible for receiving the input data via an input interface 306. Other data processors, such as the data processors B-C 302-303, can process the received data using various available procedures or algorithms (such as image processing procedures or algorithms). Additionally, one of the plurality of data processors, e.g. the data processor D 304, can be a data transmission processor, which may be responsible for transmitting the processed data to a terminal that is physically or electronically connected to the data processing system 300 or a terminal that is remote from the data processing system 300.

In accordance with various embodiments, the plurality of data processors, e.g. data processors A-D 301-304, can take advantage of a memory buffer 310 for performing various data processing tasks. For example, the memory buffer 310 can be a ring buffer. The memory buffer 310 can comprise a plurality of buffer blocks, e.g. blocks 320a-f, each of which may be associated with a base address in the memory.

As shown in FIG. 3, a controller 305 can be used for coordinating the operation of various data processors 301-304. For example, a data processor, e.g. the data processor B 302, can be an off-line module, which may need to be configured by the controller 305 to perform one or more tasks. In one example, the controller 305 can provide the buffer related information, e.g. a buffer ID, to the data processor B 302. Thus, the data processor B 302 can access the buffer block with the buffer ID using a base address associated with the buffer ID.

Additionally, each buffer block 320a-f can be associated with a status indicator (not shown), which provides the related processing status associated with each buffer block. For example, the status indicator can be stored in an on-chip memory and/or in an off-chip memory. In accordance with various embodiments, the controller 305 can update the status indicator associated with a buffer block (e.g. the buffer block 320b) in the memory buffer 310 to indicate that the data processor A 301 is performing a write operation 311 on the buffer block 320b in the memory buffer 310. Alternatively, the controller 305 can update the status indicator associated with a buffer block (e.g. the buffer block 320b) in the memory buffer 310 to indicate that the data processor A 301 has completed the write operation 311 on the buffer block 320b in the memory buffer 310. Subsequently, after the data processor B 302 finishes processing the data in the buffer block 320b, the controller 305 can update (e.g. reset) the status indicator associated with the buffer block 320b in the memory buffer. Alternatively, the data processor, which performs the write operation, e.g. the write operation 311 on the buffer block 320b, can update the status indicator whenever it is appropriate (i.e., instead of relying on the controller 305 for maintaining the status indicator). For example, the Data processor A 301 can update the status indicator associated with the buffer block 320b, as soon as the Data processor A 301 has completed the write operation 311 to write received data into the buffer block 320b.

Furthermore, in order to reduce latency in data processing, the data processing system 300 allows multiple data processors to access a buffer block simultaneously. For example, the data processor A 301 can write data into the buffer block 320b, while the data processor B 302 is reading data out from the same buffer block 320b. As shown in FIG. 3, the data processor B 302 can receive fine granular control information directly from the data processor A 301. For example, such fine granular control information may indicate the status (or progress) of a write operation performed by the data processor A 301. Thus, the data processing system 300 can achieve low latency and also can reduce the burden on the controller 305 for handling a large amount of messages.

Figure 4:
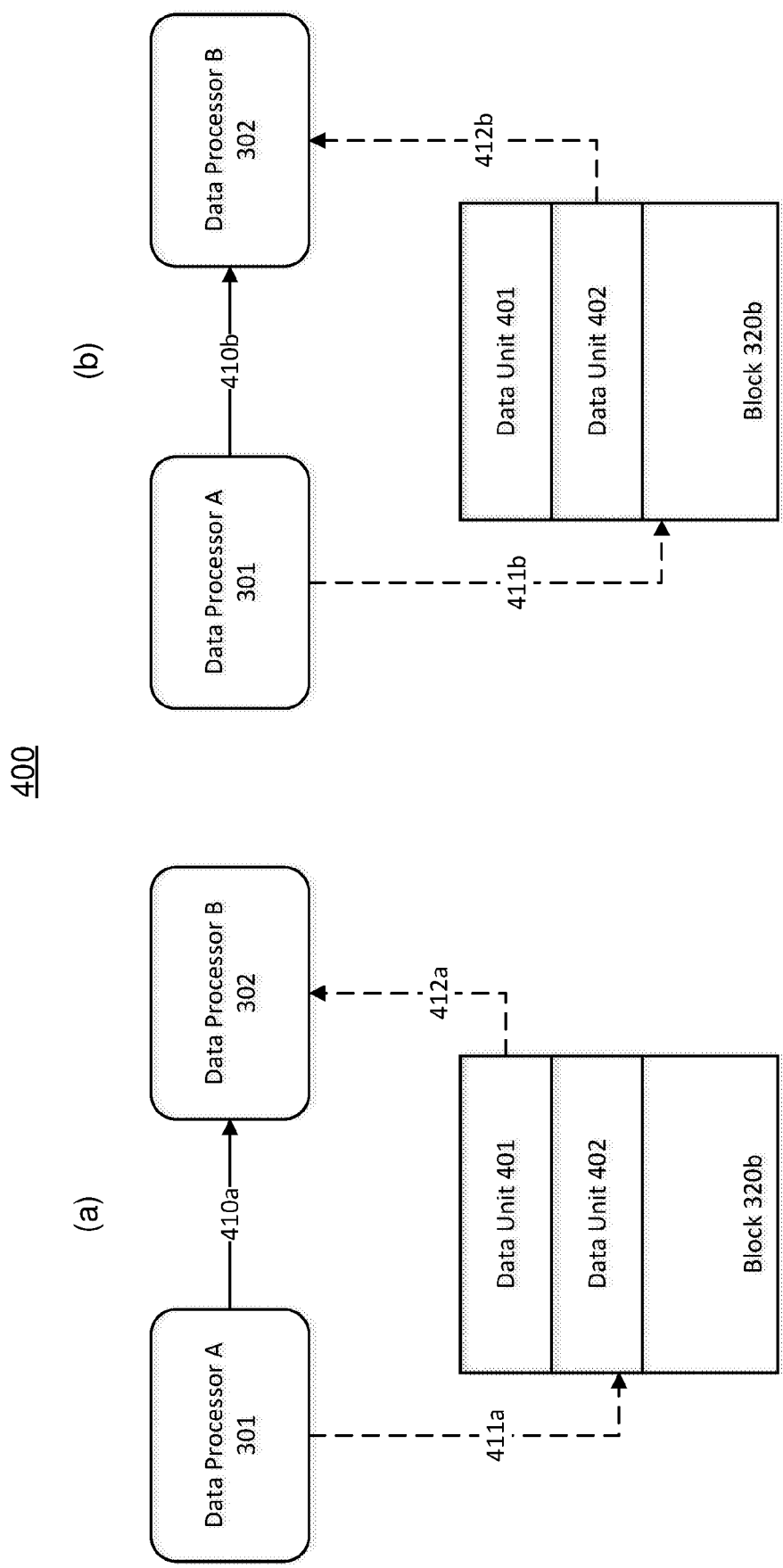
FIG. 4 shows supporting efficient data processing using the data processing system, in accordance with various embodiments of the present disclosure.

FIG. 4 shows supporting efficient data processing using the data processing system 400, in accordance with various embodiments of the present disclosure. As shown in FIG. 4(a) and FIG. 4(b), a first data processor, e.g. the data processor A 301, can perform a write operation on a buffer block 320b. For example, the buffer block 320b can be used for receiving and storing multiple data units, e.g. the Data Units 401-402. Furthermore, the data processor A 301 can provide a reference to the data processor B 302, which indicates a status (or progress) of the write operation performed by the data processor A 301. Thus, the data processing system 400 can avoid sending messages to an intermediate entity, such as a controller (not shown), in order to reduce the messaging burden on the intermediate entity. In one example, by taking advantage of a direct wire connection, the data processor A 301 can provide the reference 410a to the data processor B 302 periodically using electric signals for achieving reliability and efficiency.

In accordance with various embodiments, the data processor B 302 can use a predetermined threshold to determine whether the buffer block 320b (processing target buffer block or simply target buffer block) contains enough data for being processed by the data processor B 302. For example, the predetermined threshold can indicate whether a data unit to be processed is available at the buffer block 320b. Alternatively, the predetermined threshold may define a data unit that to be processed by a data processor. In various embodiments, a data unit can define a unit of data, such as a slice or a tile in an image frame, which may be processed together or sequentially to achieve efficiency. In accordance with various embodiments, the predetermined threshold can be evaluated based on the received reference information 410a. For example, the received reference information 410a may include information that indicates the percentage of a buffer block, total bytes or lines that have been completed by the write operation etc.

As shown in FIG. 4(a), the data processor A 301 can perform a write operation 411a for writing data in the Data Unit 402 in the buffer block 320b. For example, the data processor A 301 can provide fine granular control information, such as a current line count, to the data processor B 302. Such a line count may be larger than the line number for Data Unit 401, but smaller than the line number for Data Unit 402. Thus, Data processor B 302 may obtain (e.g. via performing a read operation 412a) data from the data unit 401 of the buffer block 320b and may wait for the data processor A 301 to finish writing data in the Data Unit 402, until enough data is available for the Data Unit 402 (e.g. to be processed as a whole).

As shown in FIG. 4(b), the data processor A 301 can perform a write operation 411b for writing data in the buffer block 320b. The data processor A 301 can provide fine granular control information 410b, which may include a current line count, to the data processor B 302. This line count may be larger than the line number for Data Unit 402, which indicates that a write operation 411b performed by the data processor A 301 has finished writing data in the Data Unit 402. Thus, the Data processor B 302 can obtain (e.g. via performing a read operation 412b) the data unit 402 out from the buffer block 320b, since enough data is available in the Data Unit 402 for being processed as a whole. As a result, the data processing system 300 can achieve both low latency and reduce the burden on the controller 305 for handling messages.

Furthermore, the data processor A 301 may proceed to write data in a different buffer block in the memory buffer. In accordance with various embodiments, this buffer block can be the next buffer block based on evaluating the base address of the buffer block 320b. Alternatively, this buffer block can be a preassigned buffer block.

Figure 5:
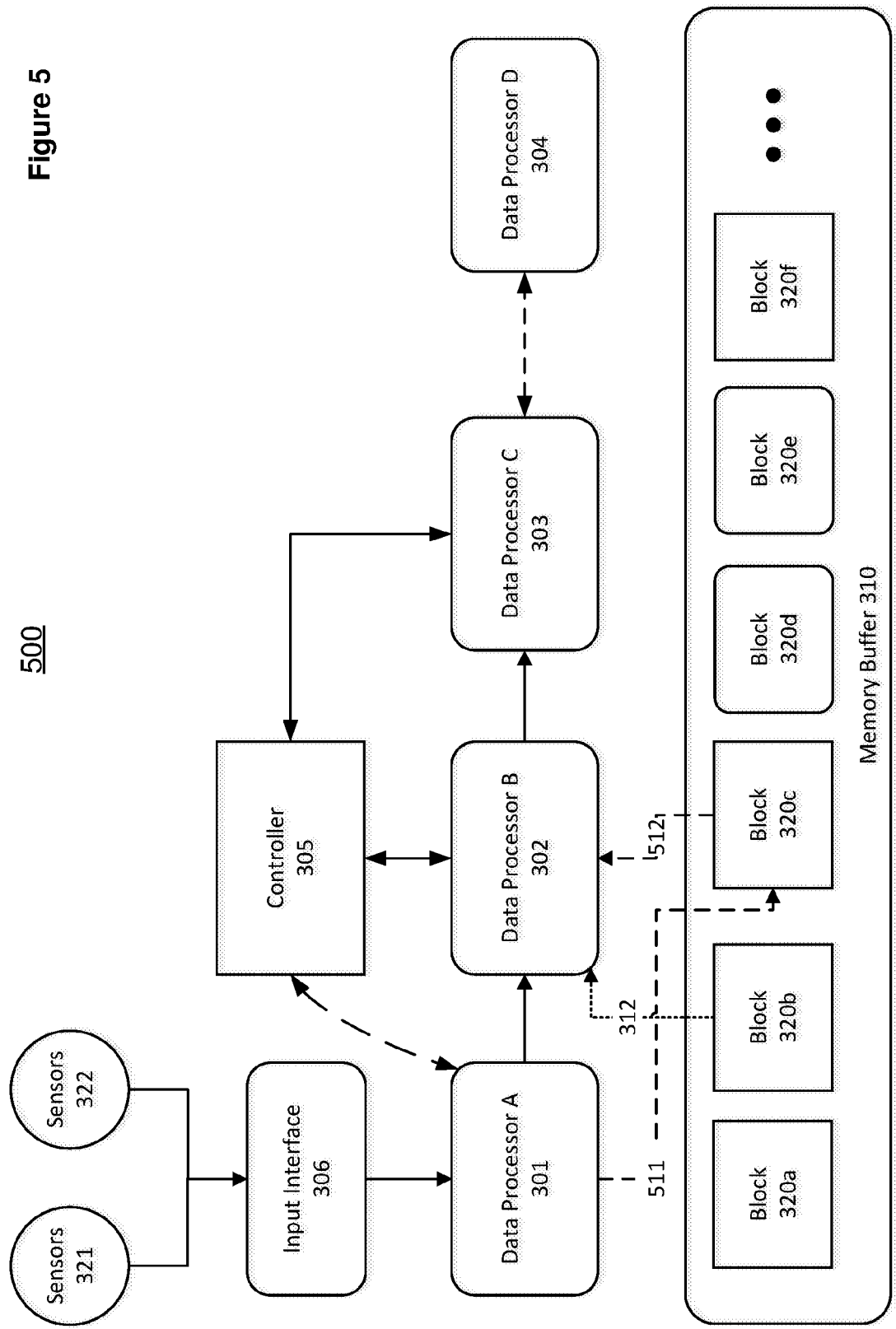
FIG. 5 shows coordinating data processing using different buffer blocks, in accordance with various embodiments of the present disclosure.

FIG. 5 shows coordinating data processing using different buffer blocks, in accordance with various embodiments of the present disclosure. As shown in FIG. 5, an image processing system 500 can employ a plurality of data processors, such as data processors A-D 301-304, for performing various data processing tasks. The plurality of data processors 301-304 can take advantage of a memory buffer 310, which includes a plurality of buffer blocks (e.g. blocks 320a-f), for processing data received from one or more sensors 321-322.

For example, data processor A 301 can be a data input processor, which can receive input data from sensors 321-322 via an input interface 306. Also, the data processor A 301 can write the received (and/or processed) data into one or more buffer blocks in the memory buffer 310. After the data processor A 301 finishes writing data into the buffer block 302b, the data processor A 301 may start to write data into the buffer block 320c. Additionally, the data processor B 302 can process the data obtained from the block 320b (e.g., via performing the read operation 312), while the data processor A 301 is writing data into the buffer block 320c (e.g., via performing the write operation 511).

In accordance with various embodiments, a data processor, e.g. the data processor B 302, can send a message (such as an interrupt) to the controller 305, indicating that it has finished processing data in a particular buffer block, e.g. Block 320b (i.e. it is available for processing more data). Subsequently, the controller 305 can determine the buffer block (another processing target buffer block), from which the data processor B 302 may proceed to read data for processing.

As shown in FIG. 5, communication 313 may be established between the controller 305 and the data processor A 301. For example, the controller 305 may inquire the data processor A 301 for its status. In response, the data processor A 301 may indicate to the controller 305 that it is writing data into the buffer block 320c. After receiving the response from the data processor A 301, the controller 305 can provide a reference to the data processor B 302. This reference may indicate that data processor B 302 may be able to obtain data from the buffer block 320c (e.g., via the read operation 512), in order to obtain the latest data.

After receiving the instruction from the controller 305, the data processor B 302 may check or confirm whether it can start to perform a read operation 512 to read data out from the buffer block 320c. As shown in FIG. 5, the data processor B 302 may receive other reference information, such as fine granular control information indicating the status or progress of the write operation 511, from the data processor A 301. The data processor B 302 can evaluate the instruction received from the controller 305 based on such fine granular control information, without a need to communicate with the controller 305 repeatedly. Thus, the data processing system 300 can achieve low latency and reduce the burden on the controller 305 for processing messages.

Figure 6:
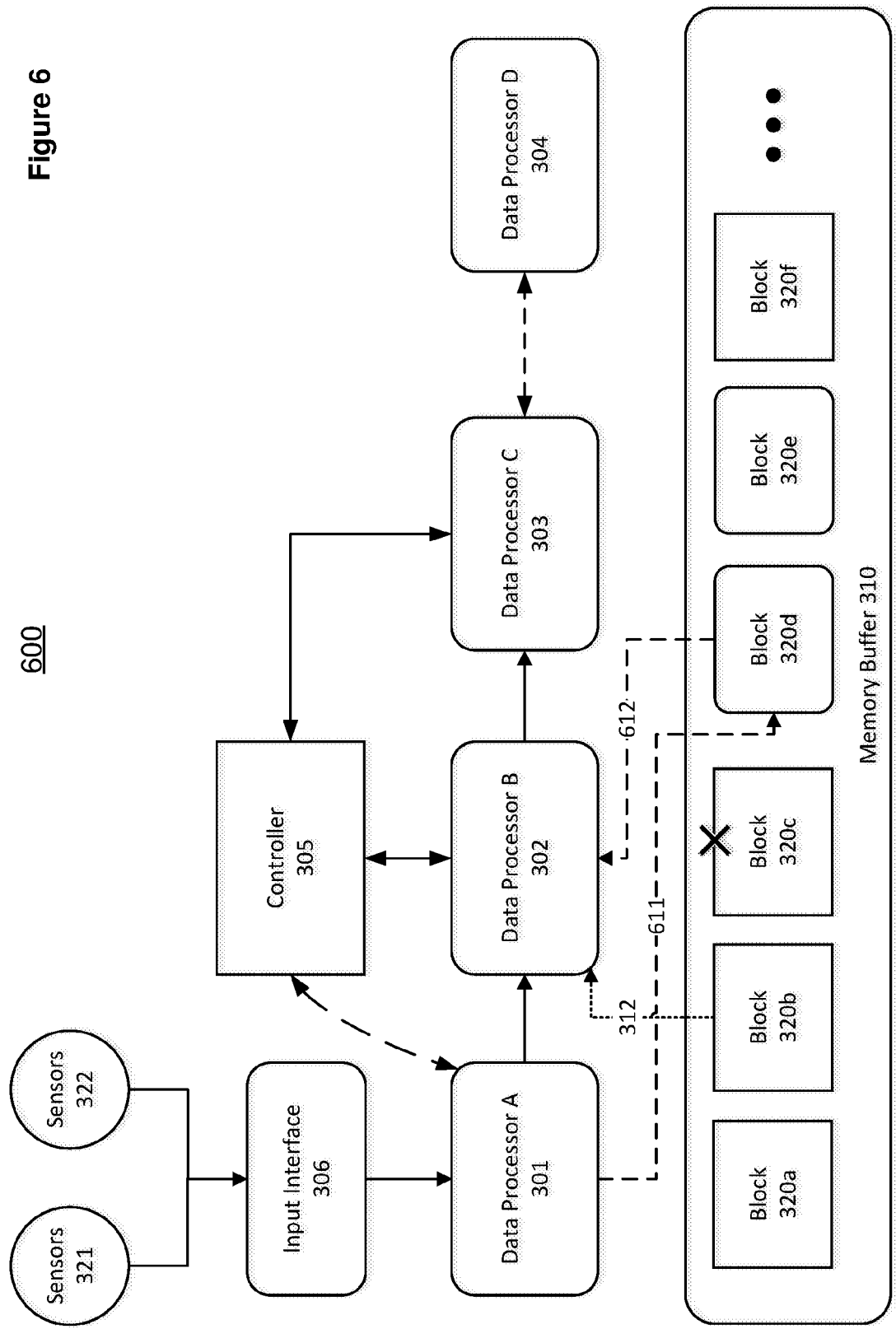
FIG. 6 shows skipping a buffer block in data processing, in accordance with various embodiments of the present disclosure.

FIG. 6 shows skipping a buffer block in data processing, in accordance with various embodiments of the present disclosure. As shown in FIG. 6, an image processing system 600 can employ a plurality of data processors, such as data processors A-D 301-304, for performing various data processing tasks. The plurality of data processors, such as data processors A-D 301-304, can take advantage of a memory buffer 310, which includes a plurality of buffer blocks (e.g. blocks 320a-f), for processing data received from one or more sensors 321-322 via an input interface 306.

In accordance with various embodiments, the controller 305 can identify situations when processing delay may occur. For example, the controller 305 may detect that the progress of the write operation 611 by the data processor A 301 is substantially ahead of the progress of the read operation 312 by the data processor B 302 (i.e. the data processor B 302 is lagging behind in data processing). As shown in FIG. 6, the data processor A 301 may be performing a write operation 611 to write data into a block 320*d* after finishing writing data into block 320*c*. When the data processor B 302 finishes processing data from the Block 320*b*, the data processor B 302 can send a message to the controller 305. In response, the controller 305 can direct the data processor B 302 to perform a read operation 612 to read and start processing data from the Block 320*d* (i.e. skipping the data stored in buffer block 320*c* in the memory buffer 310), in order to catch up with the data processing.

Figure 7:
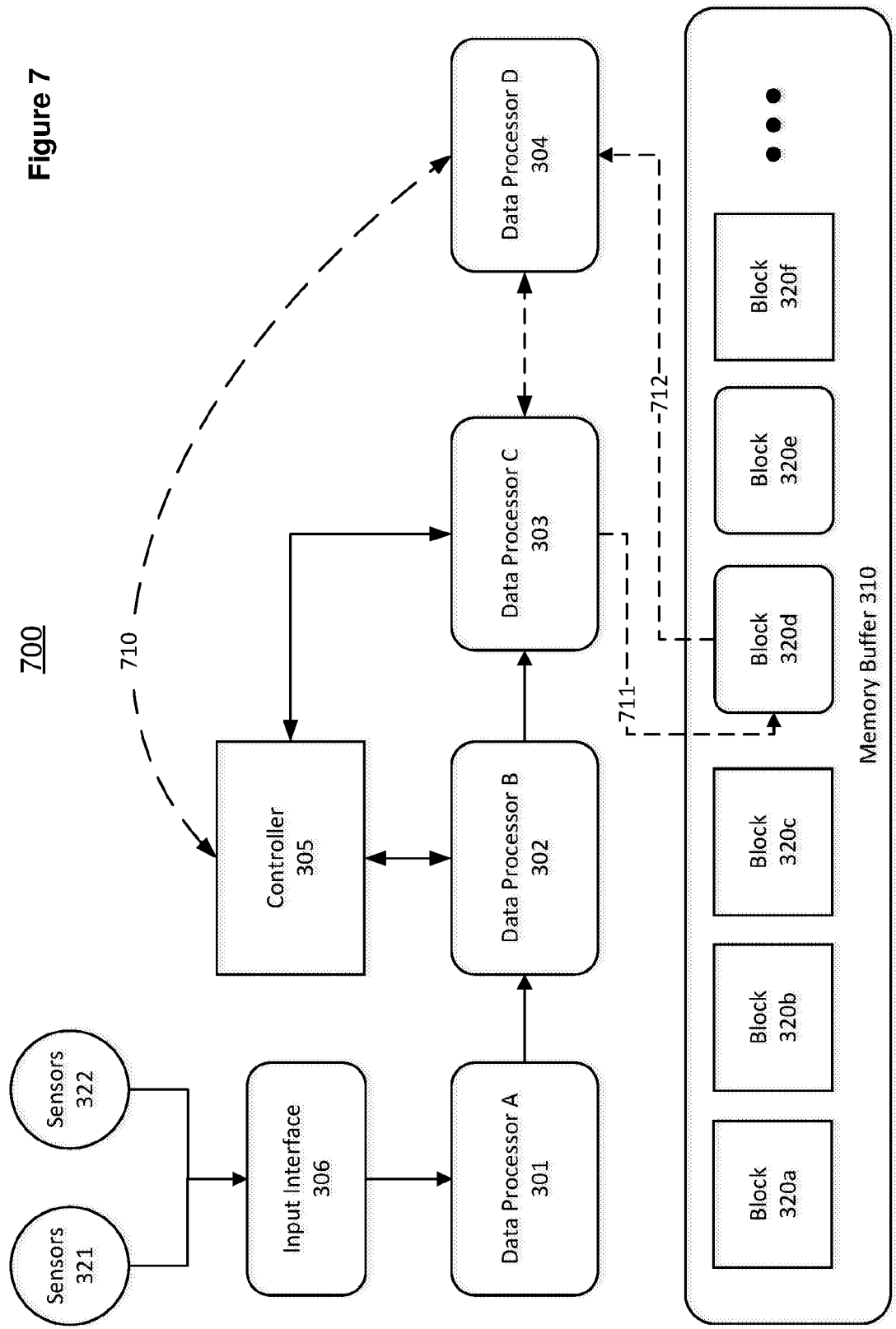
FIG. 7 shows processing data using the data processing system, in accordance with various embodiments of the present disclosure.

FIG. 7 shows processing data using the data processing system, in accordance with various embodiments of the present disclosure. As shown in FIG. 7, an image processing system 700 can employ a plurality of data processors, such as data processors A-D 301-304, for performing various data processing tasks. The plurality of data processors, such as data processors A-D 301-304, can take advantage of a memory buffer 310, which includes a plurality of buffer blocks (e.g. blocks 320*a-f*), for processing data received from one or more sensors 321-322 via an input interface 306.

In accordance with various embodiments, a data processor can obtain information for determining from which buffer block it may obtain data to process. For example, the data processor D 304 may be a data transmission processor, which can transmit the processed data to a terminal (not shown). In turn, the terminal, e.g. a remote terminal, can receive the transmitted data and make the data available, e.g. for displaying.

As shown in FIG. 7, there is no direct wire connection between the data processor D 304 and an upstream data processor, e.g. the data processor C 303. Instead of receiving such information directly from the data processor C 303 (e.g. via a direct wired connection), the data processor D 304 may obtain such information from the controller 305 indirectly (e.g., through one or more existing connections via the controller 305) through a communication connection 710 with the controller. The controller 305 can inquire and obtain reference information from the data processor C 303. Such reference information may indicate into which buffer block that the data processor C 303 is performing or has already performed a written operation. Based on the obtained reference information, the controller 305 can determine from which buffer block that the data processor D 304 may start to obtain data for processing.

As shown in FIG. 7, the data processor C 303 may perform a write operation 711 to write the processed data into a buffer block (e.g., block 320*d*), and the data processor D 304 may perform a read operation 712 to read the data stored in the buffer block (e.g., block 320*d*). Further, the reference information obtained from the data processor C 303 may indicate that it is currently writing into the buffer block 320*d*. Thus, the controller 305 can direct the data processor D 304 to obtain data from the buffer block 320*d* in order to reduce latency and avoid unnecessary delay.

Figure 8:
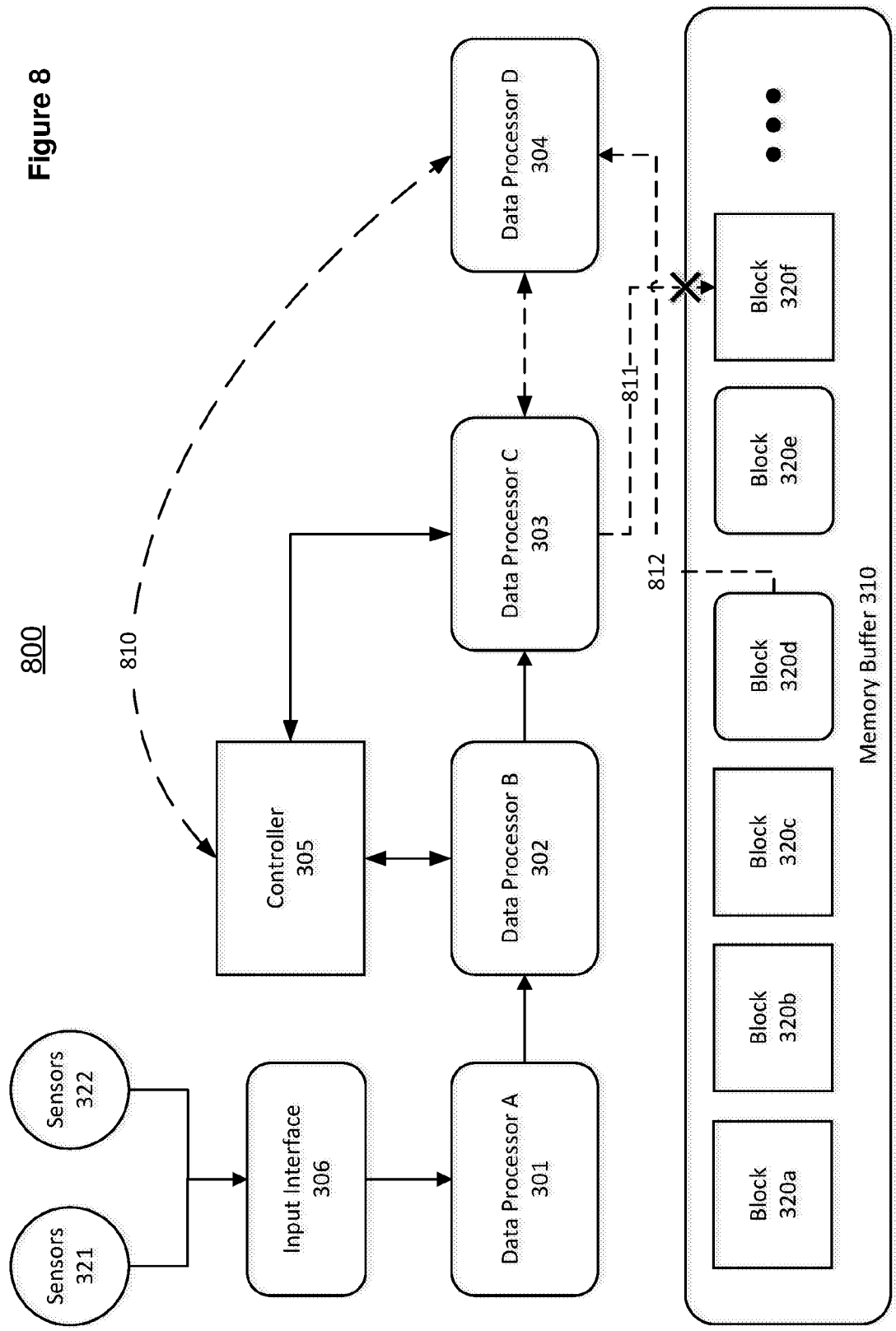
FIG. 8 shows coordinating the data processing in the data processing system, in accordance with various embodiments of the present disclosure.

FIG. 8 shows coordinating data processing in the data processing system, in accordance with various embodiments of the present disclosure. As shown in FIG. 8, an image processing system 800 can employ a plurality of data processors, such as data processors A-D 301-304, for performing various data processing tasks. The plurality of data processors, such as data processors A-D 301-304, can take advantage of a memory buffer 310, which includes a plurality of buffer blocks (e.g. blocks 320*a-f*), for processing data received from one or more sensors 321-322 via an input interface 306. For example, the data processor D 304 can be a data transmission processor, which can transmit the processed data to a remote terminal (not shown).

In accordance with various embodiments, the controller 305 can identify situations when processing delay occurs. For example, the controller 305 may detect that the progress of a write operation 811 by the data processor C 303 is substantially ahead of the progress of a read operation 812 by the data processor D 304 (i.e. the data processor D 304 is lagging behind in data processing). As shown in FIG. 8, the data processor C 303 may be writing data into a block 320*f* after completing writing data into the block 320*e*, while the data processor D 304 is reading out and processing data from the Block 320*d*. In such a case, the controller 305 can direct the data processor C 303 to stop writing data into the block 320*f* or slow down (i.e. reduce rate) in writing data into the buffer block 320*f*, to prevent buffer overflow.

Figure 9:
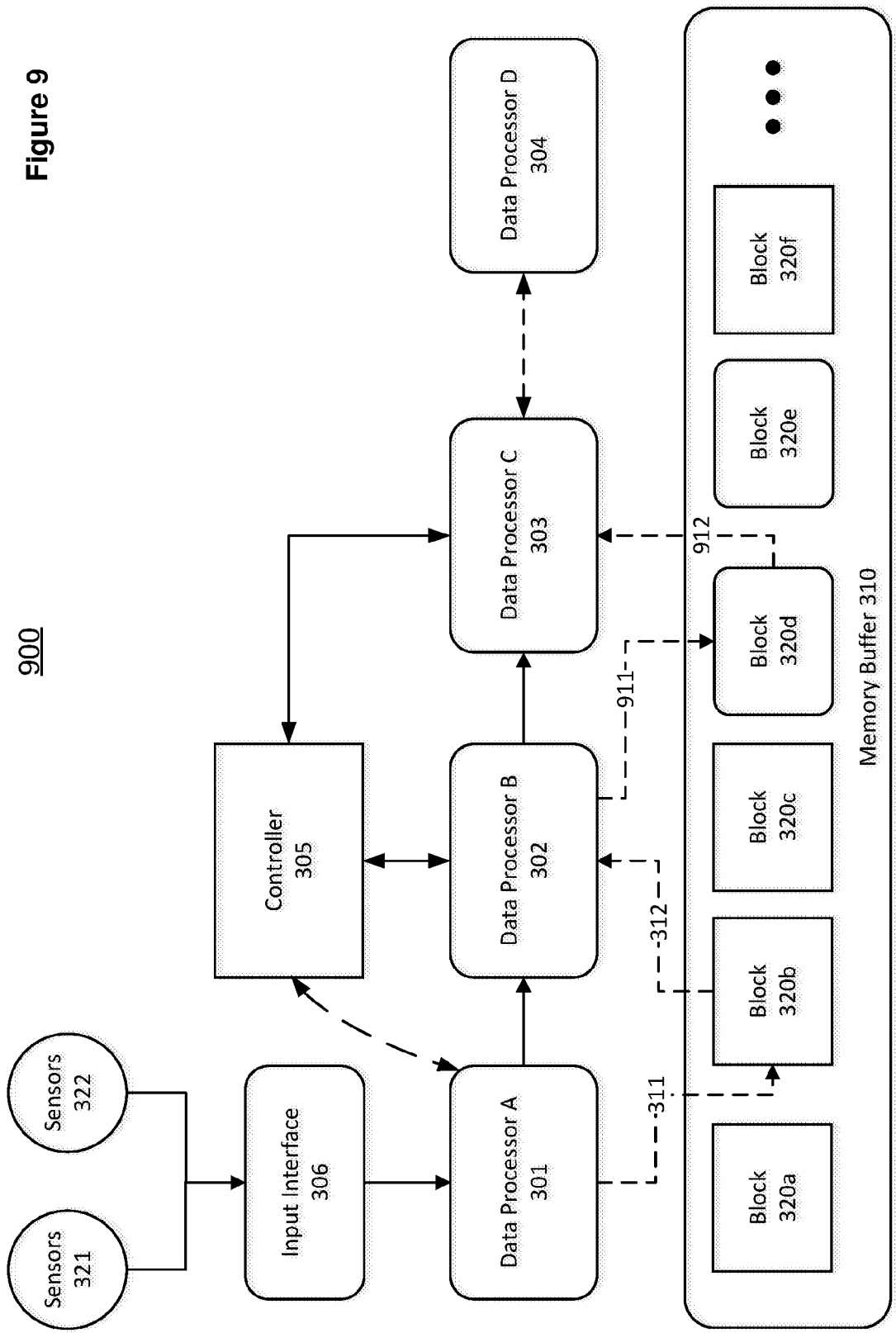
FIG. 9 shows processing data in a sequential fashion, in accordance with various embodiments of the present disclosure.

FIG. 9 shows processing data in a sequential fashion, in accordance with various embodiments of the present disclosure. As shown in FIG. 9, the data processing system 900 can employ multiple data processors to perform data processing tasks sequentially. For example, a plurality of data processors, such as data processors A-D 301-304, can take advantage of a memory buffer 310, which includes a plurality of buffer blocks (e.g. blocks 320*a-f*), for processing data received from one or more sensors 321-322 via an input interface 306.

As shown in FIG. 9, the data processor A 301 can perform a write operation 311 to write data into the buffer block 320*b*, and the data processor B 302 can perform a read operation 312 to read the data out from the buffer block 320*b* before processing the data. For example, the data processor B 302 can use a predetermined threshold for determining whether the buffer block 320*b* contains enough data to be processed by the data processor B 302. Then, the data processor B 302 can obtain the data to be processed from the buffer block 320*b* in the memory buffer 310, when the buffer block contains enough data to be processed by the data processor B 302. Furthermore, the data processor B 302 can process the data obtained from the buffer block 320*b* in the memory buffer 310.

In accordance with various embodiments of the present disclosure, the data processor B 302 can perform a write operation 911 to write the processed data into another buffer block (e.g. the buffer block 320*d*) for further processing, and the data processor C 303 can perform a read operation 912 to read data from the buffer block that stores the data (e.g., the buffer block 320*d*). For example, the write operation 911 and the read operation 312 can be performed in either a synchronous fashion or in an asynchronous fashion. As shown in FIG. 9, the data processor C 303 can obtain from the controller 305 a reference, which may include a buffer ID that indicates the base address of the buffer block 320*d* in the memory buffer 310. Additionally, the data processor C 303 can receive other reference information that may indicate a status or progress of the write operation 911 for writing data into the memory buffer 310 by the data processor B 302, from the data processor B 302.

Similarly to the data processor B 302, the data processor C 303 can use a predetermined threshold for determining whether the buffer block 320*d* contains enough data to be processed by the data processor C 303. In accordance with various embodiments, the predetermined threshold used by the data processor B 302 can be the same as or substantially similar to the predetermined threshold used by the data processor C 303. For example, the predetermined threshold used by both the data processor B 302 and the data processor C 303 can be based on a data unit in data processing, e.g. a slice in an image frame for image processing. Alternatively, the predetermined threshold used by the data processor B 302 and the predetermined threshold used by the data processor C 303 can be different, e.g. as a result of processing data at different data processing stages.

Then, the data processor C 303 can obtain the data to be processed from the buffer block 320*d* in the memory buffer 310 using the obtained reference, such as a buffer ID, after the buffer block is loaded with enough data to be processed by the data processor C 303. Thus, the data processor C 303 can process the data obtained from the buffer block 320*d* in the memory buffer 310 in order to reduce latency. Additionally, the data processor C 303 can write the processed data into a buffer block in the memory buffer 310 for further processing in a similar fashion without limitation.

Figure 10:
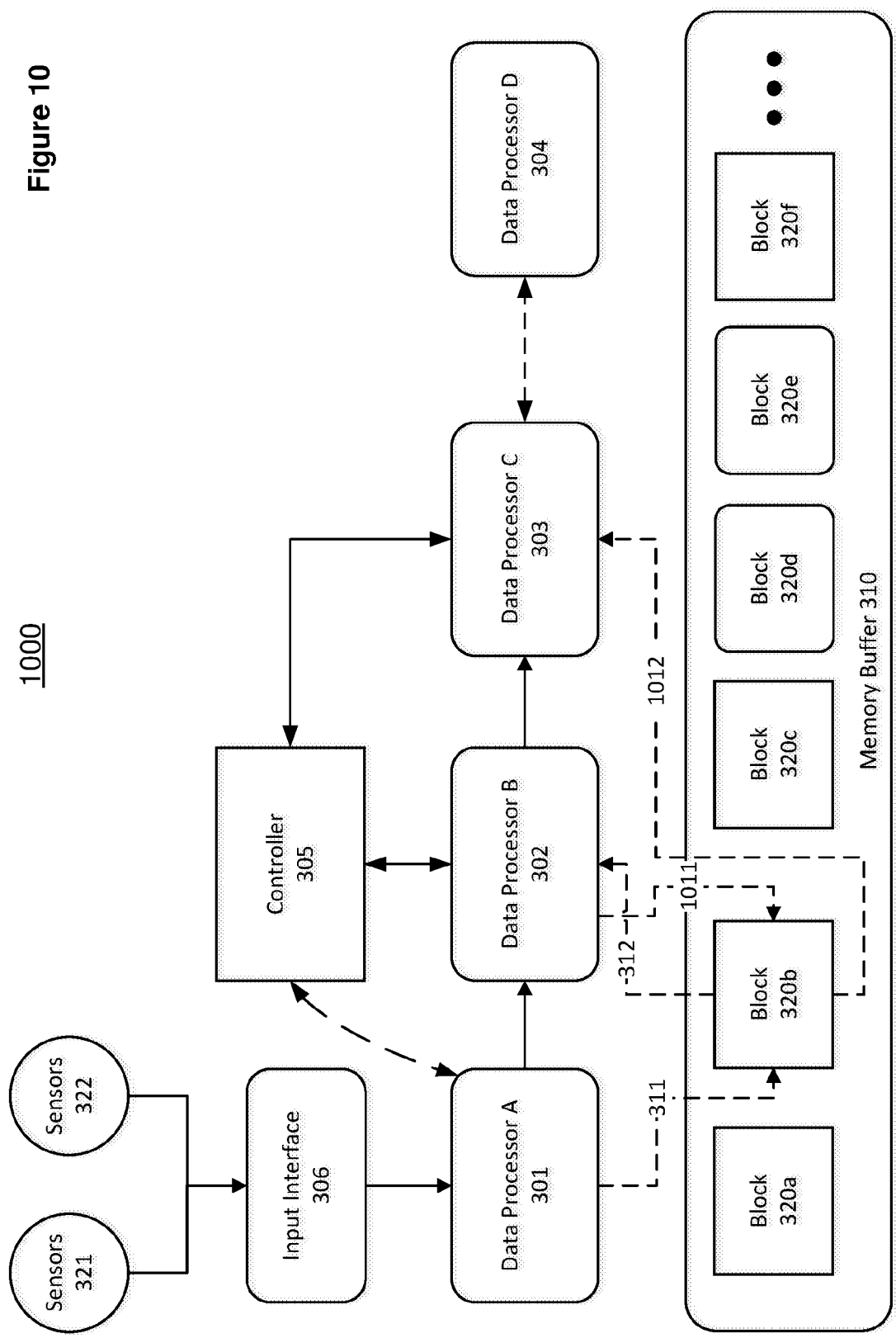
FIG. 10 shows processing data in a sequential fashion based on a buffer block, in accordance with various embodiments of the present disclosure.

FIG. 10 shows processing data in a sequential fashion based on a buffer block, in accordance with various embodiments of the present disclosure. As shown in FIG. 10, the data processing system 1000 can employ multiple data processors that operates to perform data processing tasks sequentially. For example, a plurality of data processors, such as data processors A-D 301-304, can take advantage of a memory buffer 310, which includes a plurality of buffer blocks (e.g. blocks 320*a-f*), for processing data received from one or more sensors 321-322 via an input interface 306.

As shown in FIG. 10, the data processor A 301 can perform a write operation 311 to write data into the buffer block 320*b*, and the data processor B 302 can perform a read operation 312 to read the data out from the buffer block 320*b* before processing. Furthermore, the data processor B 302 can use a predetermined threshold for determining whether the buffer block 320*b* is loaded with enough data to be processed by the data processor B 302. Then, the data processor B 302 can obtain the data to be processed from the buffer block 320*b* in the memory buffer 310, when the buffer block contains enough data to be processed by the data processor B 302. Thus, the data processor B 302 can process the data obtained from the buffer block in the memory buffer.

In accordance with various embodiments of the present disclosure, the data processor B 302 can perform a write operation 1011 to write the processed data into the buffer block 320*b* for further processing. In accordance with various embodiments, the write operation 1011 may only update or modify the data in the buffer block 320*b* at the same or similar location. Alternatively, the write operation 1011 may write the data in a different portion of the buffer block 320*b*.

As shown in FIG. 10, the data processor C 303 can obtain, from the controller 305, a reference such as a buffer ID, which indicates the base address of the buffer block 320*b* in the memory. In order to reduce latency, the data processor C 303 can receive other reference information from the data processor B 302. Such reference information may indicate a status or progress of the write operation 1011 in writing data into the memory buffer 310 by the data processor B 302.

In accordance with various embodiments, the data processor C 303 can receive the reference information from an upstream data processor, such as the data processor A 301, so that the data processor C 303 can obtain and process the data in the block 320*b* written by the data processor A 301, which may also be an upstream data processor for the data processor B 302.

Similarly to the data Processor B 302, the data processor C 303 can use a predetermined threshold for determining whether the buffer block 320*b* contains enough data to be processed by the data processor C 303. In accordance with various embodiments, the predetermined threshold used by the data Processor B 302 can be the same as or substantially similar to the predetermined threshold used by the data Processor C 303, e.g. based on a data unit for data processing. Alternatively, the predetermined threshold used by the data Processor B 302 and the predetermined threshold used by the data Processor C 303 can be different for the processing data in different states at different data processing stages.

Then, the data processor C 303 can obtain data for processing from the buffer block 320*b* in the memory buffer 310 using the reference, after the buffer block 320*b* contains enough data to be processed by the data processor C 303. Thus, the data processor C 303 can process the data obtained from the buffer block 320*b* in the memory buffer. Additionally, the data processor C 303 can write the processed data into a buffer block in the memory buffer 310 for further processing in a similar fashion without limitation.

Figure 11:
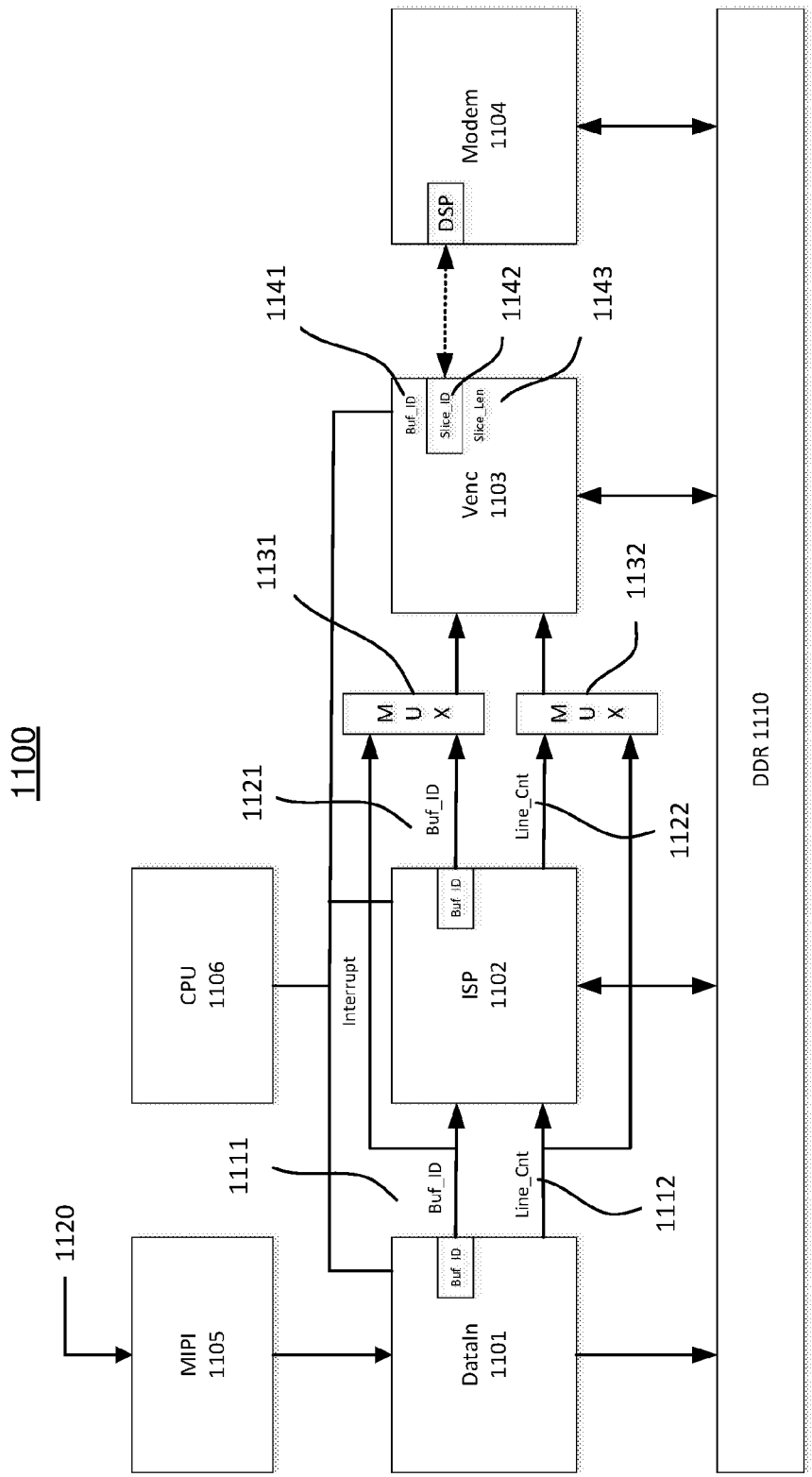
FIG. 11 shows an exemplary image processing system, in accordance with various embodiments of the present disclosure.

FIG. 11 shows an exemplary image processing system, in accordance with various embodiments of the present disclosure. As shown in FIG. 11, an image processing system 1100 can employ a plurality of data processors 1101-1104 for performing various imaging processing tasks.

In accordance with various embodiments, the plurality of data processors 1101-1104 can be used for processing the received image frames 1120. For example, the image processing system 1100 can include a data input processor (e.g. DataIn 1101), which can receive image frames 1120, via an input interface such as a mobile industry processor interface (MIPI) 1105. Furthermore, the image processing system 1100 can include an image signal processor (e.g. ISP 1102), which can process the received image frames 1120 using various image signal processing techniques. Also, the image processing system 1100 can include a codec processor (e.g. Venc 1103), which can encode the image information obtained from an upstream data processor (e.g., DataIn 1101 or ISP 1102). Moreover, the image processing system 1100 can include a data transmission processor (e.g. Modem 1104), which can transmit the encoded image to a remote terminal, e.g. for displaying.

In accordance with various embodiments, each of the data processors 1101-1104 can be a standalone processor chip, a portion of a processor chip such as a system on chip (SOC), or a core in a processor chip. In accordance with various embodiments, the image processing system 1100 can be deployed on a movable platform. For example, the image processing system 1100 may be deployed onboard or offboard a UAV. The image processing system 1100 can efficiently process the images and/or videos that are captured by a camera carried by the UAV.

Furthermore, the image processing system 1100 can use (a controller on) a CPU 1106 for coordinating the operation of the plurality of data processors 1101-1104. For example, the controller may rely on an interrupt mechanism provided by the CPU 1106, which can be based on a software interrupt handler running on the CPU 1106.

In accordance with various embodiments, the image processing system 1100 can take advantage of a memory buffer, which may be implemented using a DDR 1110. For example, the memory buffer can be implemented using a ring buffer (e.g. with eight buffer blocks). Each buffer block can be assigned with a buffer identifier (ID), which can uniquely identify a buffer block in the memory buffer. Also, each buffer block can be associated with a base address, which can be used by a data processor for accessing the data contained in the buffer block.

Additionally, each buffer block can be configured (and used) for storing data in unit, in order to achieve efficiency in data processing. For example, each buffer block may contain one image frame, which may be divided into one or more data units, such as slices or tiles. Alternatively, each buffer block may contain multiple image frames and each data unit can be a single image frame.

In order to efficiently process the received image frames 1120, the controller can coordinate the data processors 1101-1104 for accessing and communicating data via the memory buffer in DDR 1110. As shown in FIG. 11, the data input processor, DataIn 1101, can receive the input image frames 1120 via the MIPI interface 1105. Furthermore, the data input processor, DataIn 1101, can perform a write operation to write the received image frames 1120 into the memory buffer in DDR 1110. For example, the data input processor, DataIn 1101 can write each image frame into a single buffer block. The data input processor, DataIn 1101, can maintain a status indicator such as a "valid" flag for the particular buffer block (e.g. in the ring buffer). In one instance, DataIn 1101 can set the "valid" flag to 1, after finishing writing data in a particular buffer block. Optionally, the data input processor, DataIn 1101, can maintain the base address for each particular buffer block.

As shown in FIG. 11, the image signal processor, ISP 1102, can process the image frames stored in the memory buffer in DDR 1110. In accordance with various embodiments, the image signal processor, ISP 1102, which can be an offline module, may receive instructions from the CPU 1106 for performing various image processing tasks. For example, the CPU 1106 can provide a buffer ID for a buffer block, which stores an image frame to be processed, to the ISP 1102. Thus, the ISP 1102 can access the data stored in the buffer block based on a base address for the buffer block associated with the buffer ID. Then, the ISP 1102 can obtain data from the buffer block in the memory buffer from the DDR 1110 and process the obtained data.

In accordance with various embodiments, the image processing system 1100 can support a highly efficient image processing process at sub-frame level (e.g. at the slice level) in order to lower the latency in processing the image data. For example, ISP 1102 can obtain, from DataIn 1101, additional reference information, which indicates a status or progress of a write operation performed by the data input processor.

In order to coordinate the processing of the image data at the slice level, ISP 1102 can determine whether the data for a particular slice is fully written (thus becomes available) in a buffer block (i.e. determining whether sufficient or enough data are available for being processed by the image signal processor in a buffer block). Thus, the predetermined threshold can ensure that a slice to be processed is available in the buffer block for the ISP 1102. For example, the predetermined threshold can be based on a line count, which indicates the number of lines in an image that have been written into a buffer block (with a particular buffer ID).

As shown in FIG. 11, DataIn 1101 can provide status information, such as a buffer ID (e.g. buf_ID 1111) and a line count (e.g. Lin_cnt 1112), to the ISP 1102 via a hard-wired connection between DataIn 1101 and ISP 1102. ISP 1102 can compare the buf_ID 1111 received from DataIn 1101 with the buffer ID in the reference received from the CPU 1106. If the buf_ID 1111 is different from the buffer ID in the reference received from the CPU 1106, then ISP 1102 can determine that DataIn 1101 has completed the write operation for writing image data in the particular buffer block, in which case ISP 1102 can process the image frame stored in the particular buffer block. On the other hand, if the buf_ID 1111 is the same as the buffer ID in the reference received from the CPU 1106, then ISP 1102 can determine that DataIn 1101 is writing data in the buffer block, in which case ISP 1102 may need to determine whether enough data are available in the particular buffer block at a sub-frame level by applying a predetermined threshold. For example, the ISP 1102 can determine that there are enough data by evaluating whether the Lin_cnt 1112 received from DataIn 1101 indicates that the next slice to be processed in the image frame is available in the particular buffer block. Then, ISP 1102 can process the image data obtained from the buffer block in the memory buffer and provide the processed data to a downstream data processor, e.g. the codec processor, via the memory buffer in DDR 110.

As shown in FIG. 11, a codec processor, Venc 1103, can encode the image data received from DataIn 1101 or ISP 1102. Venc 1103 can receive a reference (e.g. a buffer ID) from a controller on the CPU 1106. The reference can indicate a base address for a buffer block in the memory that contains data to be encoded by the codec processor. Also, Venc 1103 can receive another reference from an upstream data processor, such as the data input processor or the image signal processor. In various embodiments, Venc 1103 can receive a reference from ISP 1102, which indicates a status (or progress) of writing data into the memory buffer by the image signal processor. For example, the reference may comprise a buffer block identifier (Buf_ID 1111) and a count of the lines completed by the image signal processor (Line_Cnt 1122).

Furthermore, Venc 1103 can evaluate the received Buf_ID 1111 with the buffer ID in the reference received from the CPU 1106. If the Buf_ID 1121 is different from the buffer ID in the reference received from the CPU 1106, then DataIn 1101 has already completed the writing of image data in the particular buffer block. Thus, Venc 1103 can proceed to encode the image data stored in the particular buffer block. On the other hand, if the Buf_ID 1121 is the same as the buffer ID in the reference received from the CPU 1106, then ISP 1102 can be aware that DataIn 1101 is writing data in the particular buffer block, in which case ISP 1102 may need to determine whether enough data are available in the particular buffer block by applying a predetermined threshold. For example, the ISP 1102 can determine that there are enough data by evaluating whether the Lin_cnt 1122 received from ISP 1102 indicates that the next slice to be encoded in the image frame is available in the particular buffer block.

Then, Venc 1103 can obtain data from the buffer block in the memory buffer when the buffer block contains enough data to be processed by the codec processor, Venc 1103. Also, Venc 1103 can process the data obtained from a different buffer block in the memory buffer.

Alternatively, Venc 1103 can obtain the data that are written into the DDR 1110 by DataIn 1101, e.g. in various situations when ISP 1102 is not used. As shown in FIG. 11, Venc 1103 can receive the Buf_ID 1111 and Line_Cnt 1112 from DataIn 1101. In accordance with various embodiments, one or more muxplexing interfaces can be used for receiving the status information from different data processors. For example, a MUX interface 1131 can be used for receiving Buf_ID 1111 from DataIn 1101 and Buf_ID 1111 from ISP 1102. Also, a MUX interface 1132 can be used for receiving the Line_Cnt 1112 from DataIn 1101 and Line_Cnt 1122 from ISP 1102. Thus, the image processing system 1100 allows for switching between different image processing modes using different configurations for handling different situations.

Moreover, the data processing system 1100 can further include a data transmission processor, such as a Modem 1104. As shown in FIG. 11, a hard wire connection may not exist between the Venc 1103 and the Modem 1104. For example, the codec processor, Venc 1103, can maintain the indicators, such as Buf_ID 1141, Slice_ID 1142, and Slice_Len 1143, in one or more registers. The Modem 1104 can inquire Venc 1103 for such information, and determines whether the encoded data stored in the DDR 1110 is sufficient for transmission. Then, the Modem 1104 can obtain these information, e.g. via a connection through the CPU 1106, and proceed to transmit the encoded image information in the corresponding buffer block in the DDR 1100, e.g. with a help of one or more digital signal processors (DSPs).

In accordance with various embodiments, the system can ensure that each encoded image frame is appropriately transmitted and received by a remote terminal (such as a remote control terminal for a UAV), in order to ensure that the remote terminal can successfully receive and decode the image information, e.g. for displaying. In the case when the transmitting of the encoded image frames is interrupted or not satisfactory, the Venc processor can be directed to stop or slow down processing, in order to prevent the frame buffer from overflowing.

Figure 12:
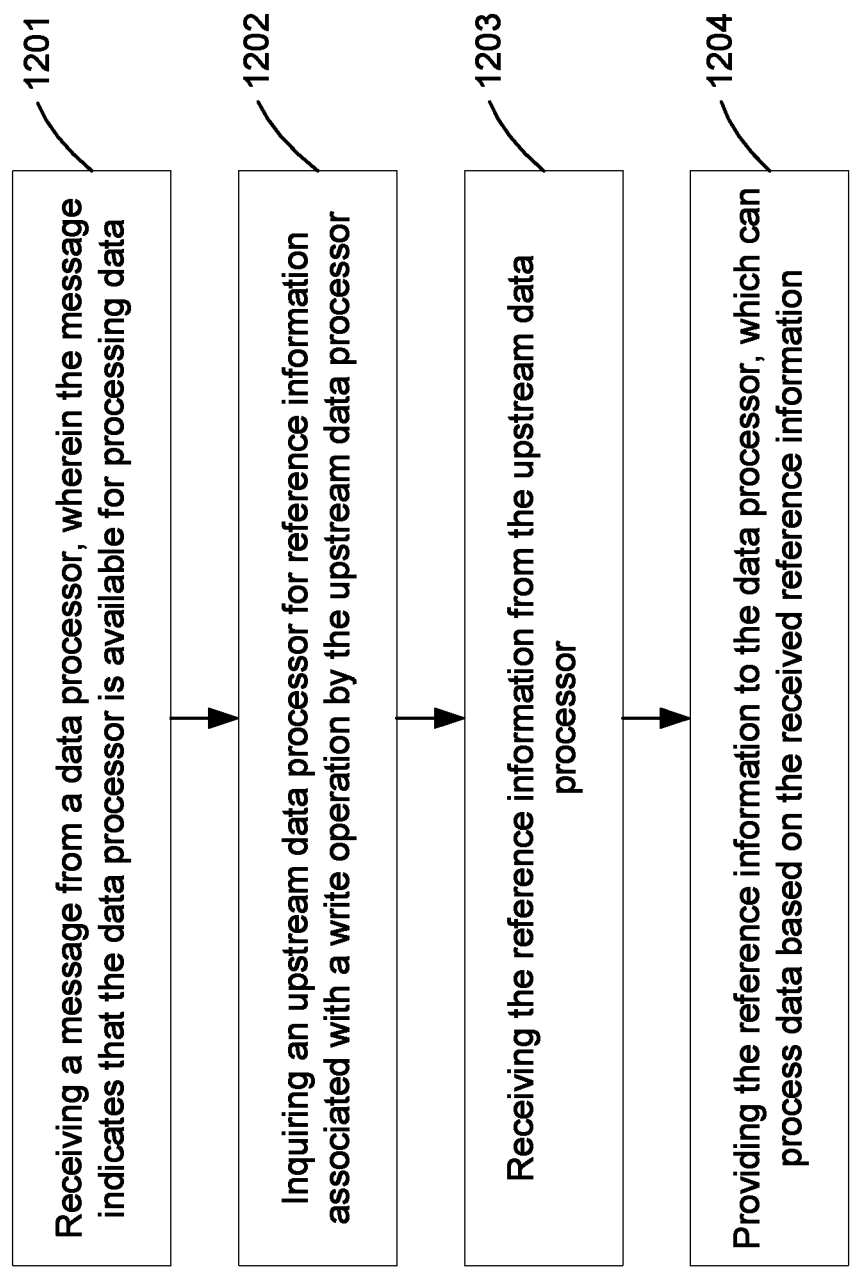
FIG. 12 shows a flowchart of using a controller for data processing, in accordance with various embodiments of the present disclosure.

FIG. 12 shows a flowchart of using a controller for data processing, in accordance with various embodiments of the present disclosure. As shown in FIG. 12, at step 1201, the controller can receive a message from a data processor, wherein the message indicates that the data processor is available for processing data. Furthermore, at step 1202, the controller can inquire an upstream data processor for reference information associated with a write operation by the upstream data processor. At step 1203, the controller can receive the reference information from the upstream data processor. Then, at step 1204, the controller can provide the reference information to the data processor, which can process data based on the received reference information.

Figure 13:
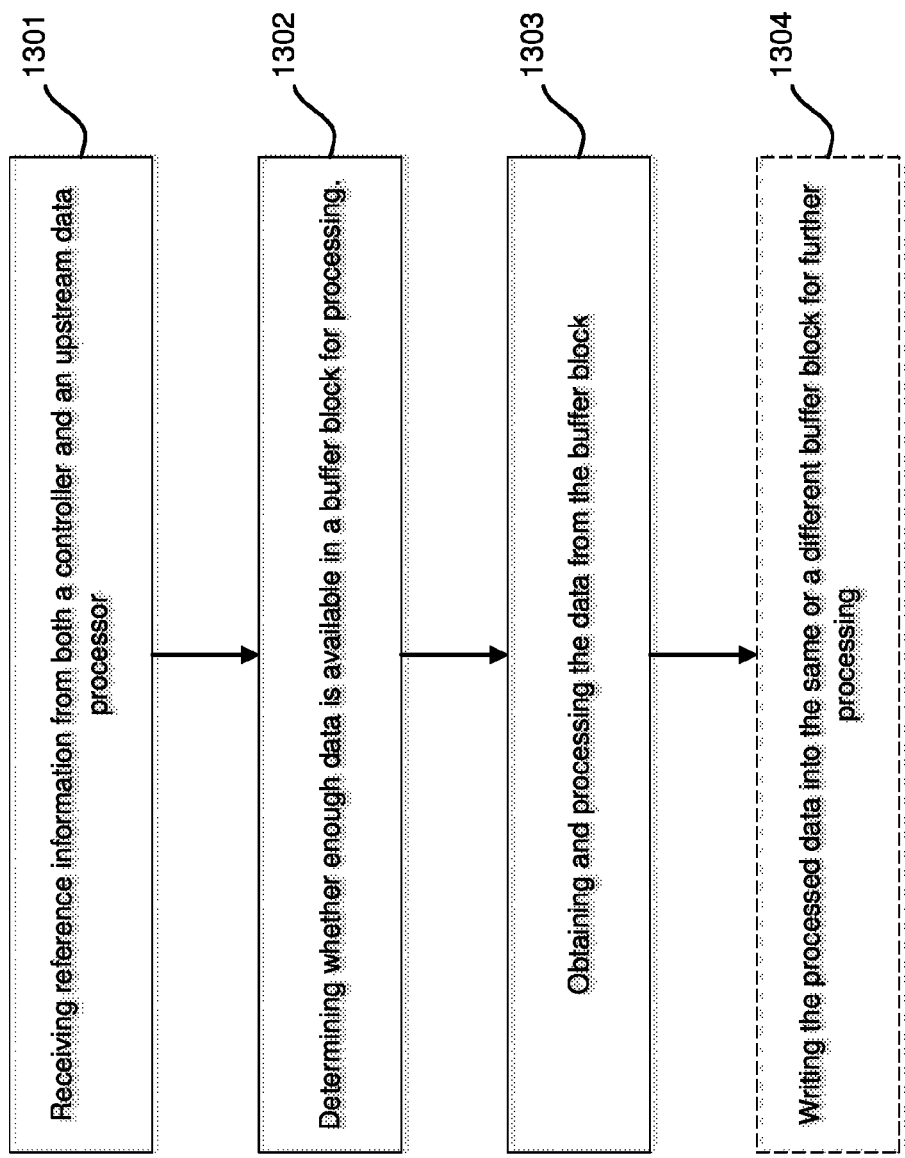
FIG. 13 shows a flowchart of using a data processor for data processing, in accordance with various embodiments of the present disclosure.

FIG. 13 shows a flowchart of using a data processor, in accordance with various embodiments of the present disclosure. As shown in FIG. 13, at step 1301, the data processor can receive reference information from both a controller and an upstream data processor. Furthermore, at step 1302, the data processor can determine whether enough data is available in a buffer block for processing. Then, at step 1303, the data processor can obtain and process the data from the buffer block. Optionally, at step 1304, the data processor can write the processed data into the same or a different buffer block for further processing.

Many features of the present disclosure can be performed in, using, or with the assistance of hardware, software, firmware, or combinations thereof. Consequently, features of the present disclosure may be implemented using a processing system (e.g., including one or more processors). Exemplary processors can include, without limitation, one or more general purpose microprocessors (for example, single or multi-core processors), application-specific integrated circuits, application-specific instruction-set processors, graphics processing units, physics processing units, digital signal processing units, coprocessors, network processing units, audio processing units, encryption processing units, and the like.

Features of the present disclosure can be implemented in, using, or with the assistance of a computer program product which is a storage medium (media) or computer readable medium (media) having instructions stored thereon/in which can be used to program a processing system to perform any of the features presented herein. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

Stored on any one of the machine readable medium (media), features of the present disclosure can be incorporated in software and/or firmware for controlling the hardware of a processing system, and for enabling a processing system to interact with other mechanism utilizing the results of the present disclosure. Such software or firmware may include, but is not limited to, application code, device drivers, operating systems and execution environments/containers.

Features of the disclosure may also be implemented in hardware using, for example, hardware components such as application specific integrated circuits (ASICs) and field-programmable gate array (FPGA) devices. Implementation of the hardware state machine so as to perform the functions described herein will be apparent to persons skilled in the relevant art.

Additionally, the present disclosure may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

While various embodiments of the present disclosure have been described above, it should be understood that they have been presented by way of example, and not limitation. It will be apparent to persons skilled in the relevant art that various changes in form and detail can be made therein without departing from the spirit and scope of the disclosure.

The present disclosure has been described above with the aid of functional building blocks illustrating the performance of specified functions and relationships thereof. The boundaries of these functional building blocks have often been arbitrarily defined herein for the convenience of the description. Alternative boundaries can be defined so long as the specified functions and relationships thereof are appropriately performed. Any such alternative boundaries are thus within the scope and spirit of the disclosure.

The foregoing description of the present disclosure has been provided for the purposes of illustration and description. It is not intended to be exhaustive or to limit the disclosure to the precise forms disclosed. The breadth and scope of the present disclosure should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the disclosure and its practical application, thereby enabling others skilled in the art to understand the disclosure for various embodiments and with various modifications that are suited to the particular use contemplated. It is intended that the scope of the invention be defined by the following claims and their equivalence.

What is claimed is:

1. A system for supporting data processing on a movable platform, comprising:
 a memory buffer with a plurality of buffer blocks;
 a first data processor;
 a second data processor; and
 a controller;

wherein:
the first data processor operates to:
perform a write operation to write data into the memory buffer, and
provide a first reference to the second data processor, wherein the first reference indicates a status or progress of the write operation by the first data processor;
the controller operates to provide a second reference, indicating a first target buffer block in the memory buffer, to the second data processor; and
the second data processor operates to:
receive the first reference and the second reference;
use a threshold to determine, based on the first reference, whether the first target buffer block contains enough data to be processed by the second data processor;
obtain data to be processed from the first target buffer block in the memory buffer using the second reference, in response to determining that the first target buffer block contains enough data to be processed; and
process the data obtained from the first target buffer block in the memory buffer,
wherein after receiving a message from the second data processor indicating that the second data processor has finished processing the data obtained from the first target buffer block, the controller operates to:
obtain a third reference from the first data processor, wherein the third reference indicates a second target buffer block in the memory buffer, into which the first data processor is writing data; and
provide the third reference to the second data processor.

2. The system of claim 1, wherein at least one of the first data processor or the controller operates to update an indicator associated with the first target buffer block in the memory buffer, when the first data processor begins to perform the write operation on the first target buffer block in the memory buffer or after the first data processor has completed the write operation on the first target buffer block in the memory buffer.

3. The system of claim 2, wherein the controller operates to update the indicator associated with the first target buffer block in the memory buffer, after the second data processor finishes processing the data obtained from the first target buffer block.

4. The system of claim 1, wherein:
the second target buffer block follows a third target buffer block in the memory buffer, the first data processor having completed writing data into the third target buffer block; and
the second data processor operates to skip data in the third target buffer block in the memory buffer.

5. The system of claim 1, wherein:
the second target buffer block follows a third target buffer block in the memory buffer, the first data processor having completed writing data into the third target buffer block; and
the first data processor operates to stop writing data into the second target buffer block or reduce a rate in writing data into the second target buffer block.

6. The system of claim 1, wherein the threshold defines a data unit that is used by the second data processor to process the data in the first target buffer block.

7. The system of claim 1,
wherein the write operation is a first write operation, and the threshold is a first threshold;
the system further comprising a third data processor, wherein the third data processor operates to:
receive a fourth reference from the second data processor, wherein the fourth reference indicates a status or progress of a second write operation to write data into the memory buffer by the second data processor;
receive a fifth reference from the controller, wherein the fifth reference indicates the second target buffer block in the memory buffer;
use a second threshold to determine whether the second target buffer block contains enough data to be processed by the third data processor based on the fourth reference;
obtain data to be processed from the second target buffer block in the memory buffer using the fifth reference, in response to determining that the second target buffer block contains enough data to be processed by the third data processor, and
process the data obtained from the second target buffer block in the memory buffer.

8. The system of claim 7, wherein the first target buffer block and the second target buffer block are a same buffer block.

9. The system of claim 8, wherein the third data processor further operates to receive the first reference from the first data processor.

10. The system of claim 1, wherein the second data processor receives the first reference via the controller.

11. The system of claim 1, wherein each of the plurality of buffer blocks in the memory buffer is used to store an image frame with one or more slices.

12. The system of claim 1, wherein the first data processor is a data input processor that operates to receive one or more image frames each comprising one or more slices.

13. The system of claim 12, wherein the second data processor is an image signal processor that operates to obtain and process an image frame from the first target buffer block in the memory buffer.

14. The system of claim 13, wherein the first reference comprises a buffer block identifier (ID) and a count of lines completed by the data input processor.

15. The system of claim 14, wherein the image signal processor operates to process a slice of the image frame in response to the count of lines completed indicating that the slice of the image frame is available from the first target buffer block.

16. The system of claim 1, wherein first data processor is an image signal processor and the second data processor is an encoding processor.

17. The system of claim 1, wherein first data processor is an encoding processor and the second data processor is a data transmitting processor.

18. A method for supporting data processing, comprising:
obtaining a first reference from a first data processor, by a second data processor, wherein the first reference indicates a status or progress of a write operation to write data into a memory buffer by the first data processor;
obtaining, by the second data processor, a second reference from a controller, wherein the second reference is associated with a first target buffer block in a memory buffer;

using, by the second data processor based on the first reference, a threshold to determine whether the first target buffer block contains enough data to be processed by the second data processor;

obtaining, by the second data processor, data to be processed from the first target buffer block in the memory buffer using the second reference, in response to determining that the first target buffer block contains enough data to be processed by the second data processor;

processing, by the second data processor, the data obtained from the first target buffer block in the memory buffer;

after receiving a message from the second data processor indicating that the second data processor has finished processing the data obtained from the first target buffer block, obtaining, by the controller, a third reference from the first data processor, wherein the third reference indicates a second target buffer block in the memory buffer, into which the first data processor is writing data; and providing, by the controller, the third reference to the second data processor.

19. A system for supporting data processing, comprising:
a memory buffer with a plurality of buffer blocks;
a plurality of data processors that operate to communicate data via the memory buffer, wherein the plurality of data processors comprise a data input processor and an image signal processor; and
a controller that operates to coordinate operation of the plurality of data processors;
wherein:
the data input processor operates to
receive input data via one or more input interfaces, wherein the input data comprises one or more image frames each comprising one or more slices; and
perform a write operation to write the received input data into the memory buffer;

the image signal processor operates to:
obtain a first reference from the data input processor, wherein the first reference indicates a status or progress of the write operation by the data input processor;
obtain a second reference from the controller, wherein the second reference indicates a first target buffer block in the memory buffer, and wherein the first target buffer block contains image data to be processed by the image signal processor;
determine whether the image data in the first target buffer block is enough for being processed by the image signal processor based on the first reference and a threshold, wherein the threshold is associated with a slice to be processed by the image signal processor;
obtain the image data from the first target buffer block in the memory buffer using the second reference, in response to determining that the image data in the first target buffer block is enough for being processed by the image signal processor; and
process the image data obtained from the first target buffer block in the memory buffer;
the controller further operates to, after receiving a message from the second data processor indicating that the second data processor has finished processing the data obtained from the first target buffer block:
obtain a third reference from the first data processor, wherein the third reference indicates a second target buffer block in the memory buffer, into which the first data processor is writing data; and
provide the third reference to the second data processor.

* * * * *